US009817280B2

United States Patent
Gan

(10) Patent No.: US 9,817,280 B2
(45) Date of Patent: Nov. 14, 2017

(54) PSVA LIQUID CRYSTAL DISPLAY PANEL COMPRISING A PIXEL ELECTRODE WHICH IS PATTERNED WITH A PLURALITY OF TRENCHES CORRESPONDING TO A PATTERN OF A PASSIVATION LAYER

(71) Applicant: Shenzhen China Star Optoelectronics Technology Co., Ltd., Shenzhen (CN)

(72) Inventor: Qiming Gan, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 267 days.

(21) Appl. No.: 14/787,766

(22) PCT Filed: Oct. 13, 2015

(86) PCT No.: PCT/CN2015/091804
§ 371 (c)(1),
(2) Date: Oct. 29, 2015

(87) PCT Pub. No.: WO2017/035915
PCT Pub. Date: Mar. 9, 2017

(65) Prior Publication Data
US 2017/0192311 A1    Jul. 6, 2017

(30) Foreign Application Priority Data
Aug. 31, 2015  (CN) .......................... 2015 1 0548278

(51) Int. Cl.
*G02F 1/1343* (2006.01)
*G02F 1/1368* (2006.01)
(Continued)

(52) U.S. Cl.
CPC ...... *G02F 1/134309* (2013.01); *G02F 1/1368* (2013.01); *G02F 1/133345* (2013.01);
(Continued)

(58) Field of Classification Search
CPC ........... G02F 2203/01; G02F 2201/121; G02F 2001/136236; G02F 2001/133742; G02F 2201/122
See application file for complete search history.

(56) References Cited

U.S. PATENT DOCUMENTS

2001/0004274 A1* 6/2001 Sakamoto ......... G02F 1/134336
349/43
2004/0041149 A1* 3/2004 Baek ................... G02F 1/13458
257/49

(Continued)

*Primary Examiner* — Paul Lee
(74) *Attorney, Agent, or Firm* — Leong C. Lei

(57) ABSTRACT

The present invention provides a PSVA liquid crystal display panel, comprising an upper substrate (1), a lower substrate (2) oppositely located to the upper substrate (1) and a liquid crystal layer (3) located between the upper substrate (1) and the lower substrate (2); the lower substrate (2) comprises a second substrate (21), a thin film transistor, a passivation layer (22) and a pixel electrode (23); the lower substrate (2) comprises a plurality of pixel areas, and the passivation layer (22) is a passivation layer which is patterned, and is respectively formed the same pattern corresponding to the plurality of pixel areas, and the pattern comprises a plurality of trenches (221) extending toward various directions; the pixel electrode (23) is entirely attached to the passivation layer (22) which is patterned and comprises a corresponding pattern with the passivation layer (22); a depth of the trench (221) is 2000-4000 Å. The PSVA liquid crystal display panel of the present invention possesses higher transmittance and excellent optical performance.

14 Claims, 4 Drawing Sheets

(51) Int. Cl.
*G02F 1/1333* (2006.01)
*H01L 27/12* (2006.01)
*G02F 1/1362* (2006.01)
*G02F 1/1337* (2006.01)

(52) U.S. Cl.
CPC ............... *G02F 1/136227* (2013.01); *G02F 2001/133742* (2013.01); *G02F 2001/136236* (2013.01); *G02F 2201/121* (2013.01); *G02F 2201/122* (2013.01); *G02F 2201/123* (2013.01); *G02F 2203/01* (2013.01); *H01L 27/1248* (2013.01)

(56) References Cited

U.S. PATENT DOCUMENTS

2008/0169473 A1\* 7/2008 Cho .................. G02F 1/133555
 257/72
2009/0147162 A1\* 6/2009 Yeom ................ G02F 1/133707
 349/33
2012/0280236 A1\* 11/2012 Kim .................. G02F 1/134363
 257/59

\* cited by examiner

PSVA LIQUID CRYSTAL DISPLAY PANEL COMPRISING A PIXEL ELECTRODE WHICH IS PATTERNED WITH A PLURALITY OF TRENCHES CORRESPONDING TO A PATTERN OF A PASSIVATION LAYER

FIELD OF THE INVENTION

The present invention relates to a display technology field, and more particularly to a PSVA liquid crystal display panel.

BACKGROUND OF THE INVENTION

In recent years, the Thin Film Transistor-LCD (TFT-LCD) has been rapidly developed and applied widely. For the TFT-LCD in the mainstream market, three types, which respectively are Twisted Nematic (TN), Super Twisted Nematic (STN), In-Plane Switching (IPS) and Vertical Alignment (VA) can be illustrated. The VA liquid crystal display possesses extremely high contrast than the liquid crystal displays of other types. It has very wide application in large scale display, such as television or etc.

The reason why the VA liquid crystal display possesses extremely high contrast is that the liquid crystal molecules are vertically aligned to the substrate surface, and no phase difference exists, and light leakage is very small, and the dark state brightness is extremely small at the dark state without applying electricity. The lower the brightness at the dark state can be, the higher the contrast is according to the contrast calculation formula. However, because the VA liquid crystal display utilizes vertical twist liquid crystals and the birefraction difference of the liquid crystal molecules is larger, the issue of the color shift under large view angle is more serious. For earning better wide view angle property for the VA liquid crystal display panel to improve the color shift issue, the multi-domain VA (MVA) technology is commonly utilized, which is to divide a sub pixel into many districts and drive the liquid crystals in respective districts to lie down toward different directions as applying voltage. Thus, the watch results from respective directions can be equal. There are many ways to achieve MVA technology. One of these ways is to process the ITO pixel electrode at one side to be a pozidriv pattern. With the special ITO pixel electrode pattern, the tilt electric field can induce the liquid crystal molecules in different areas to lie down toward different directions.

With the development of the technology, related improvement appears. The polymer-stabilized vertical alignment (PSVA) wide view angle technology can make the liquid crystal display panel possess advantages of faster response time and high transmittance. The distinguishing feature is to form polymer protrusions on the surface of the alignment film to make the liquid crystal molecules have a pre-tilted angle. The general PSVA pixel structure is to accomplish the passivation on the array substrate for protecting the channel, and then the pixel electrode deposed thereon is implemented with pattern process. As shown in FIG. 1 and FIG. 2, which is a PSVA liquid crystal display panel according to prior art, comprising an upper substrate 100 and a lower substrate 200. The upper substrate 100 comprises a first substrate 110 and a plane type common electrode 120. The lower substrate 200 comprises a second substrate 210, a passivation layer 220 and a pixel electrode 230. The pixel electrode 230 has a pozidriv pattern. However, the pixel electrode 230, which is processed to have the pozidriv pattern, forms pixel electrode branches and slits interval patterns extending toward different directions. It results in the nonuniform electrical field which is formed with the common electrode 120 of the upper substrate 110 corresponding thereto. The electrical field corresponding to the pixel electrode branch region is obviously stronger than the electrical field corresponding the silt region. Accordingly, the uneven brightness phenomenon happens in the pixel.

For solving the existing issues of the PSVA liquid crystal display panel according to prior art, a new PSVA liquid crystal display panel is proposed, which is to form patterns on the passivation layer to obtain a plurality of trenches, and then to cover the passivation layer entirely with the entire surface pixel electrode; in comparison with the PSVA liquid crystal display panel according to prior art, the PSVA liquid crystal display panel possesses advantages of high transmittance, insensitivity to the cell gap and Line/Space. However, the different trench depths result in different transmittances. There remain doubts about what kind of trench depth can make the liquid crystal display panel obtain the best optical performance, and this will bring uncertainty to the process tuning.

SUMMARY OF THE INVENTION

An objective of the present invention is to provide a PSVA liquid crystal display panel possessing high transmittance and great pixel quality to diminish the process area of the panel production for shortening the time of process tuning and raising the production efficiency of the products.

For realizing the aforesaid objective, the present invention provides a PSVA liquid crystal display panel, comprising an upper substrate, a lower substrate oppositely located to the upper substrate and a liquid crystal layer located between the upper substrate and the lower substrate;

the upper substrate comprises a first substrate, and a common electrode located on the first substrate;

the lower substrate comprises a second substrate, a thin film transistor located on the second substrate, a passivation layer located on the second substrate and the thin film transistor, and a pixel electrode located on the passivation layer;

the lower substrate comprises a plurality of pixel areas, and the passivation layer is respectively formed the same pattern corresponding to the plurality of pixel areas; the pattern comprises a plurality of trenches extending toward various directions;

the pixel electrode is an entire surface electrode of which a thickness is uniform and continuous; the pixel electrode is entirely attached to the passivation layer which is patterned and comprises a corresponding pattern with the passivation layer;

a depth of the trench is 2000-4000 Å.

A thickness of the passivation layer is great than or equal to 5000 Å.

Corresponding to each pixel area, the passivation layer is divided into four sub areas.

The pattern is a pozidriv pattern, and the passivation layer comprises a vertical main piece, a horizontal main piece orthogonally cross with the vertical main piece and a plurality of strip branches connected with the vertical main piece or the horizontal main piece and respectively extended toward periphery; the plurality of strip branches are spaced with one another and form an included angle with the vertical main piece or the horizontal main piece; the trench is located between two adjacent strip branches.

The included angle is 45 degrees.

Material of the passivation layer is Silicon Nitride.

Material of the common electrode and the pixel electrode is ITO.

The thin film transistor comprises a drain, and the passivation layer comprises a via hole correspondingly located above the drain, and the pixel electrode penetrates the via hole and is connected with the drain of the thin film transistor.

The via hole and the trenches are manufactured at the same time by one photolithography process with one gray tone mask.

The common electrode is a plane type common electrode of which a thickness is uniform and continuous.

The present invention further provides a PSVA liquid crystal display panel, comprising an upper substrate, a lower substrate oppositely located to the upper substrate and a liquid crystal layer located between the upper substrate and the lower substrate;

the upper substrate comprises a first substrate, and a common electrode located on the first substrate;

the lower substrate comprises a second substrate, a thin film transistor located on the second substrate, a passivation layer located on the second substrate and the thin film transistor, and a pixel electrode located on the passivation layer;

the lower substrate comprises a plurality of pixel areas, and the passivation layer is respectively formed the same pattern corresponding to the plurality of pixel areas; the pattern comprises a plurality of trenches extending toward various directions;

the pixel electrode is an entire surface electrode of which a thickness is uniform and continuous; the pixel electrode is entirely attached to the passivation layer which is patterned and comprises a corresponding pattern with the passivation layer;

a depth of the trench is 2000-4000 Å;

wherein a thickness of the passivation layer is great than or equal to 5000 Å;

wherein corresponding to each pixel area, the passivation layer is divided into four sub areas;

wherein material of the passivation layer is Silicon Nitride;

wherein material of the common electrode and the pixel electrode is ITO;

wherein the thin film transistor comprises a drain, and the passivation layer comprises a via hole correspondingly located above the drain, and the pixel electrode penetrates the via hole and is connected with the drain of the thin film transistor;

wherein the common electrode is a plane type common electrode of which a thickness is uniform and continuous.

The benefits of the present invention are: in the PSVA liquid crystal display panel according to the present invention, the passivation layer is a patterned passivation layer, and the patterned passivation layer comprises a plurality of trenches which are aligned in spaces, and the pixel electrode is an entire surface electrode of which a thickness is uniform and continuous, and the entire surface pixel electrode is attached to the patterned passivation layer and comprises a corresponding pattern with the passivation layer to make the liquid crystal panel possess higher transmittance; moreover, by setting the depths of the trenches between 2000-4000 Å, the liquid crystal panel can earn the great optical performance and meanwhile, the process area of the panel production can be diminished for shortening the time of process tuning and raising the production efficiency of the products.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
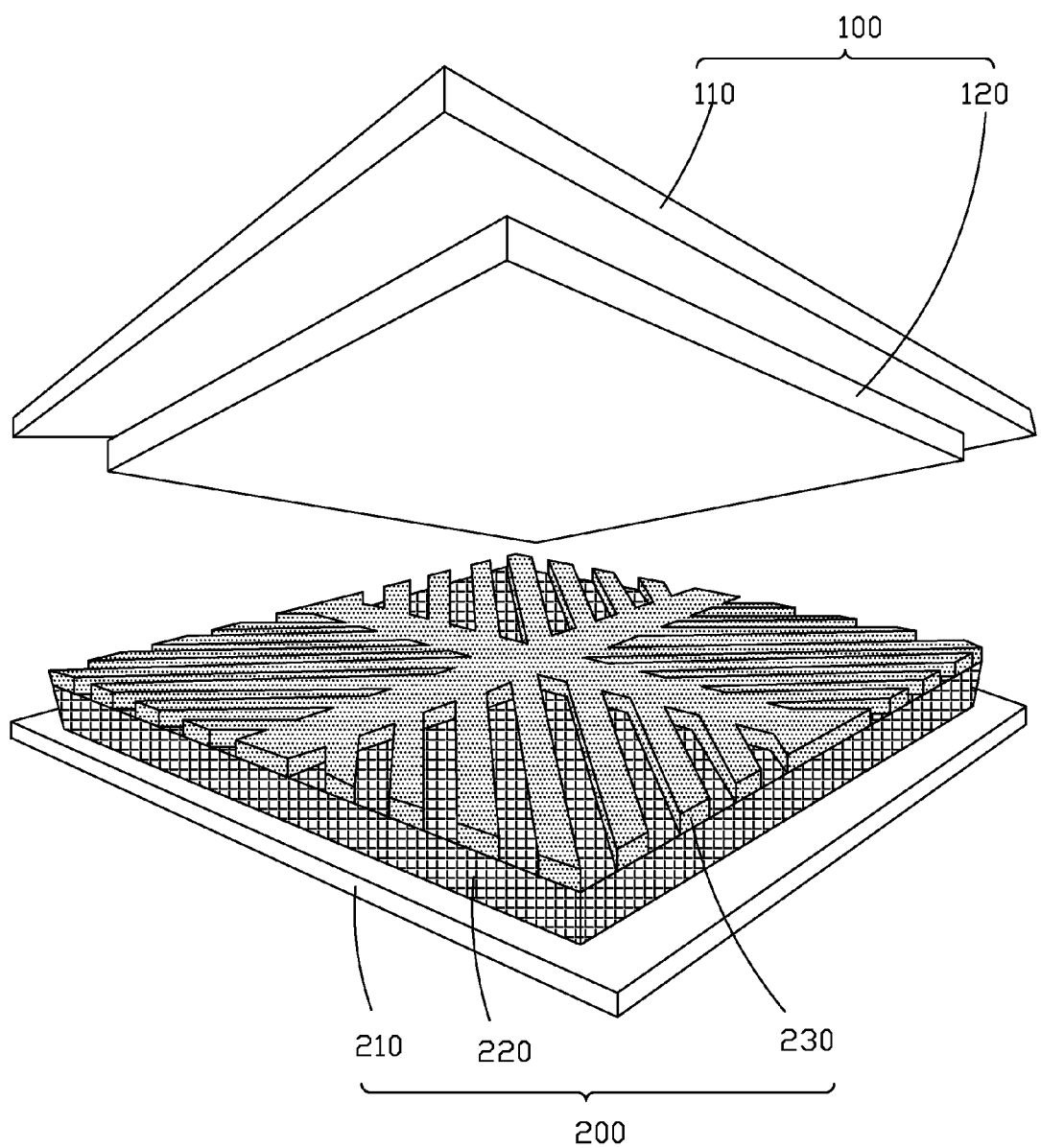
FIG. 1 is a stereoscopic structure diagram of a PSVA liquid crystal display panel according to prior art.
Figure 2:
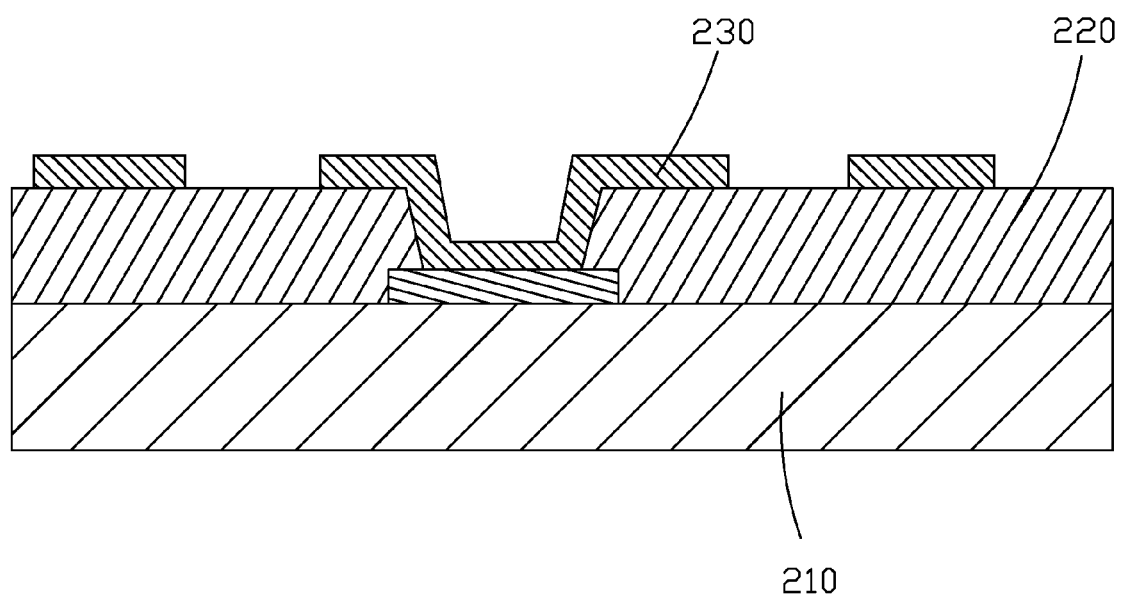
FIG. 2 is a sectional structure diagram of a lower substrate of the PSVA liquid crystal display panel in FIG. 1.
Figure 3:
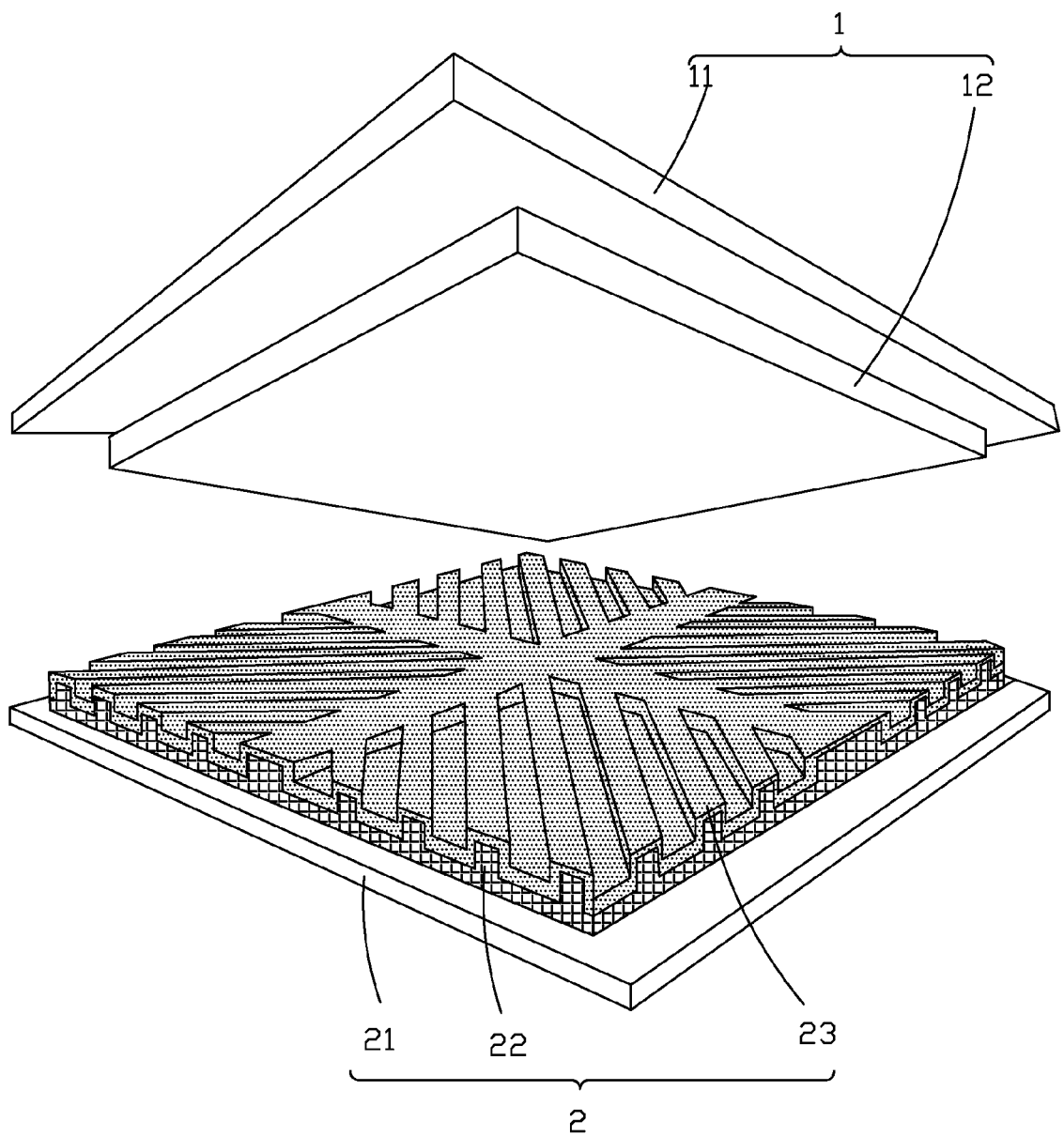
FIG. 3 is a stereoscopic structure diagram of a PSVA liquid crystal display panel according to the present invention.
Figure 4:
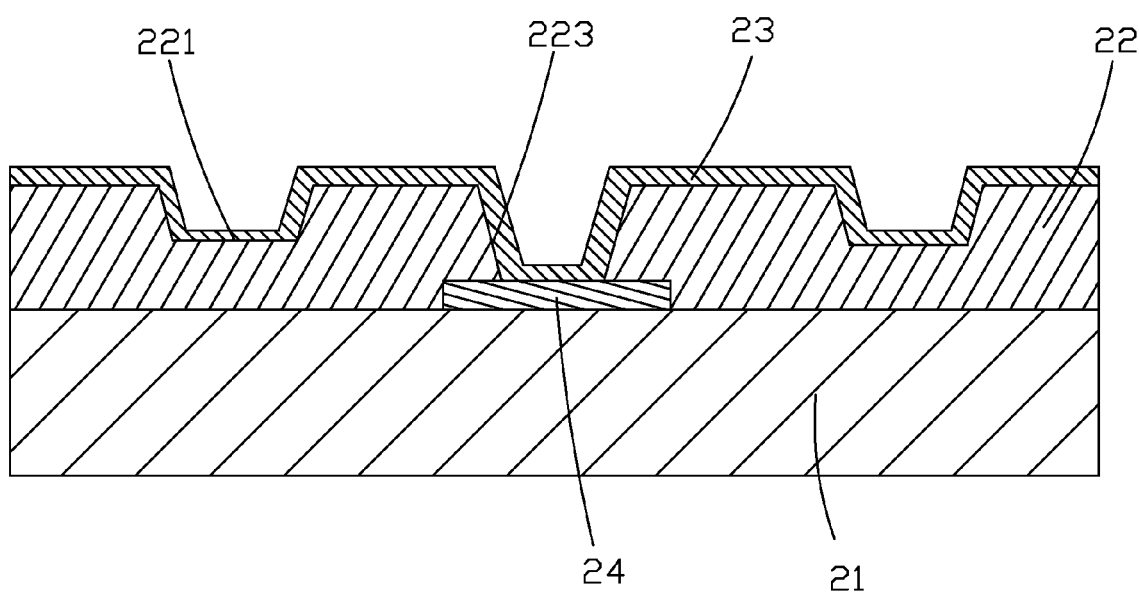
FIG. 4 is a sectional structure diagram of a lower substrate of the PSVA liquid crystal display panel in FIG. 3.

Please refer to FIG. 3 and FIG. 4. The present invention provides a PSVA liquid crystal display panel, comprising an upper substrate 1, a lower substrate 2 oppositely located to the upper substrate 1 and a liquid crystal layer (not shown) located between the upper substrate 1 and the lower substrate 2;

the upper substrate 1 comprises a first substrate 11, and a common electrode 12 located on the first substrate 11;

the lower substrate 2 comprises a second substrate 21, a thin film transistor located on the second substrate 21, a passivation layer 22 located on the second substrate 21 and the thin film transistor, and a pixel electrode 23 located on the passivation layer 22;

the lower substrate 2 comprises a plurality of pixel areas, and the passivation layer 22 is a passivation layer which is patterned, and the passivation layer 22 is respectively formed the same pattern corresponding to the plurality of pixel areas; the pattern comprises a plurality of trenches 221 extending toward various directions;

the pixel electrode 23 is an entire surface electrode of which a thickness is uniform and continuous; as shown in FIG. 3, the entire surface pixel electrode 23 covers on the passivation layer 22 which is patterned and comprises a corresponding pattern with the passivation layer 22.

In the PSVA liquid crystal display panel, the depth of the trenches 221 is an extremely important parameter. The depth of the trenches 221 profoundly and significantly influences the liquid crystal tilt and the optical performance of liquid crystal display panel. The trenches 221 on the passivation layer 22 have various depths, and the corresponding transmittances of the liquid crystal panel are different.

In the PSVA liquid crystal display panel according to prior art does not provide specific definition to the depths of the trenches 221. Therefore, it results in that the optional process parameter and the obtained optical performance seem to be random. In the present invention, the depth of the trench 221 is 2000-4000 Å. Then the alignment result of the liquid crystal is the best, and the liquid crystal panel has the best optical performance.

Specifically, a thickness of the passivation layer 22 is great than or equal to 5000 Å. The trenches 221 can be set to have different widths on actual demands.

Specifically, as shown in FIG. 3, corresponding to each pixel area, the passivation layer 22 is divided into four sub areas; the passivation layer 22 which is patterned comprises a pozidriv pattern, and the passivation layer 22 comprises a vertical main piece, a horizontal main piece orthogonally cross with the vertical main piece and a plurality of strip branches connected with the vertical main piece or the horizontal main piece and respectively extended toward periphery; the plurality of strip branches are spaced with one another and form an included angle with the vertical main piece or the horizontal main piece; the trench 221 is located between two adjacent strip branches. Specifically, the included angle is 45 degrees.

Specifically, material of the passivation layer 22 is Silicon Nitride.

Specifically, material of the common electrode 12 and the pixel electrode 23 is ITO.

Specifically, as shown in FIG. 4, the thin film transistor comprises a drain 24, and the passivation layer 22 comprises a via hole 223 correspondingly located above the drain 24, and the pixel electrode 23 penetrates the via hole 223 and is connected with the drain 24 of the thin film transistor.

Specifically, the via hole 223 and the trenches 221 can be manufactured at the same time by one photolithography process with one gray tone mask (GTM). In comparison with the PSVA liquid crystal display panel, it will not increase the complexity of the manufacture process.

Specifically, as shown in FIG. 3, the common electrode 12 is a plane type common electrode of which a thickness is uniform and continuous.

In conclusion, in the PSVA liquid crystal display panel according to the present invention, the passivation layer is a patterned passivation layer, and the patterned passivation layer comprises a plurality of trenches which are aligned in spaces, and the pixel electrode is an entire surface electrode of which a thickness is uniform and continuous, and the entire surface pixel electrode is attached to the patterned passivation layer and comprises a corresponding pattern with the passivation layer to make the liquid crystal panel possess higher transmittance; moreover, by setting the depths of the trenches between 2000-4000 Å, the liquid crystal panel can earn the great optical performance and meanwhile, the process area of the panel production can be diminished for shortening the time of process tuning and raising the production efficiency of the products.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A PSVA liquid crystal display panel, comprising an upper substrate, a lower substrate oppositely located to the upper substrate and a liquid crystal layer located between the upper substrate and the lower substrate;
   the upper substrate comprises a first substrate, and a common electrode located on the first substrate;
   the lower substrate comprises a second substrate, a thin film transistor located on the second substrate, a pas-sivation layer located on the second substrate and the thin film transistor, and a pixel electrode located on the passivation layer;
   the lower substrate comprises a plurality of pixel areas, and the passivation layer is respectively formed the same pattern corresponding to the plurality of pixel areas; the pattern comprises a plurality of trenches extending toward various directions;
   the pixel electrode is an entire surface electrode of which a thickness is uniform and continuous; the pixel electrode is entirely attached to the passivation layer which is patterned and comprises a corresponding pattern with the passivation layer;
   a depth of the trench is 2000-4000 Å.

2. The PSVA liquid crystal display panel according to claim 1, wherein a thickness of the passivation layer is great than or equal to 5000 Å.

3. The PSVA liquid crystal display panel according to claim 1, wherein corresponding to each pixel area, the passivation layer is divided into four sub areas.

4. The PSVA liquid crystal display panel according to claim 3, wherein the pattern is a pozidriv pattern, and the passivation layer comprises a vertical main piece, a horizontal main piece orthogonally cross with the vertical main piece and a plurality of strip branches connected with the vertical main piece or the horizontal main piece and respectively extended toward periphery; the plurality of strip branches are spaced with one another and form an included angle with the vertical main piece or the horizontal main piece; the trench is located between two adjacent strip branches.

5. The PSVA liquid crystal display panel according to claim 4, wherein the included angle is 45 degrees.

6. The PSVA liquid crystal display panel according to claim 1, wherein material of the passivation layer is Silicon Nitride.

7. The PSVA liquid crystal display panel according to claim 1, wherein material of the common electrode and the pixel electrode is ITO.

8. The PSVA liquid crystal display panel according to claim 1, wherein the thin film transistor comprises a drain, and the passivation layer comprises a via hole correspondingly located above the drain, and the pixel electrode penetrates the via hole and is connected with the drain of the thin film transistor.

9. The PSVA liquid crystal display panel according to claim 8, wherein the via hole and the trenches are manufactured at the same time by one photolithography process with one gray tone mask.

10. The PSVA liquid crystal display panel according to claim 1, wherein the common electrode is a plane type common electrode of which a thickness is uniform and continuous.

11. A PSVA liquid crystal display panel, comprising an upper substrate, a lower substrate oppositely located to the upper substrate and a liquid crystal layer located between the upper substrate and the lower substrate;
   the upper substrate comprises a first substrate, and a common electrode located on the first substrate;
   the lower substrate comprises a second substrate, a thin film transistor located on the second substrate, a passivation layer located on the second substrate and the thin film transistor, and a pixel electrode located on the passivation layer;
   the lower substrate comprises a plurality of pixel areas, and the passivation layer is respectively formed the same pattern corresponding to the plurality of pixel areas; the pattern comprises a plurality of trenches extending toward various directions;

the pixel electrode is an entire surface electrode of which a thickness is uniform and continuous; the pixel electrode is entirely attached to the passivation layer which is patterned and comprises a corresponding pattern with the passivation layer;

a depth of the trench is 2000-4000 Å;

wherein a thickness of the passivation layer is great than or equal to 5000 Å;

wherein corresponding to each pixel area, the passivation layer is divided into four sub areas;

wherein material of the passivation layer is Silicon Nitride;

wherein material of the common electrode and the pixel electrode is ITO;

wherein the thin film transistor comprises a drain, and the passivation layer comprises a via hole correspondingly located above the drain, and the pixel electrode penetrates the via hole and is connected with the drain of the thin film transistor;

wherein the common electrode is a plane type common electrode of which a thickness is uniform and continuous.

12. The PSVA liquid crystal display panel according to claim 11, wherein the pattern is a pozidriv pattern, and the passivation layer comprises a vertical main piece, a horizontal main piece orthogonally cross with the vertical main piece and a plurality of strip branches connected with the vertical main piece or the horizontal main piece and respectively extended toward periphery; the plurality of strip branches are spaced with one another and form an included angle with the vertical main piece or the horizontal main piece; the trench is located between two adjacent strip branches.

13. The PSVA liquid crystal display panel according to claim 12, wherein the included angle is 45 degrees.

14. The PSVA liquid crystal display panel according to claim 11, wherein the via hole and the trenches are manufactured at the same time by one photolithography process with one gray tone mask.

* * * * *